United States Patent
Gazsi (10) Patent No.: US 7,573,955 B2
(45) Date of Patent: Aug. 11, 2009

(54) DIGITAL PHASE LOCKED LOOP FOR SUB-μ TECHNOLOGIES

(75) Inventor: Lajos Gazsi, Düsseldorf (DE)

(73) Assignee: Infineon Technologies AG, Munich (DE)

( * ) Notice: Subject to any disclaimer, the term of this patent is extended or adjusted under 35 U.S.C. 154(b) by 223 days.

(21) Appl. No.: 11/501,408

(22) Filed: Aug. 9, 2006

(65) Prior Publication Data

US 2007/0030939 A1 Feb. 8, 2007

Related U.S. Application Data

(63) Continuation of application No. PCT/DE2005/000030, filed on Jan. 12, 2005.

(30) Foreign Application Priority Data

Feb. 12, 2004 (DE) .................. 10 2004 006 995

(51) Int. Cl.
*H03D 3/18* (2006.01)
(52) U.S. Cl. ..................... 375/327; 375/376
(58) Field of Classification Search ......... 375/327, 375/376

See application file for complete search history.

(56) References Cited

U.S. PATENT DOCUMENTS

| | | | |
|---|---|---|---|
| 3,900,890 A | 8/1975 | Eibner et al. | |
| 4,352,074 A | 9/1982 | Blinchikoff et al. | |
| 4,706,263 A * | 11/1987 | von der Embse | 375/343 |
| 5,124,670 A * | 6/1992 | Lawton | 331/10 |
| 5,266,907 A | 11/1993 | Dacus | |
| 5,369,404 A | 11/1994 | Galton et al. | |
| 5,727,038 A * | 3/1998 | May et al. | 375/376 |
| 5,781,044 A | 7/1998 | Riley et al. | |
| 5,786,778 A * | 7/1998 | Adams et al. | 341/61 |
| 5,834,987 A * | 11/1998 | Dent | 332/127 |
| 5,903,194 A * | 5/1999 | Opsahl et al. | 331/1 A |

(Continued)

FOREIGN PATENT DOCUMENTS

DE 197 27 810 2/1999

(Continued)

OTHER PUBLICATIONS

Chen, "A 2-V, 1.8-GHz BJT phase-locked loop", IEEE Journal of Solid-State Circuits, vol. 34, Issue 6, Jun. 1999 pp. 784-789.*

(Continued)

*Primary Examiner*—Juan A Torres
(74) *Attorney, Agent, or Firm*—Brinks Hofer Gilson & Lione (57) ABSTRACT

A digital phase locked loop has a digitally controlled oscillator for generating an output frequency, a phase detector device for detecting the phase difference between a reference frequency and an output frequency of the oscillator. The phase detector device contains a delta-sigma frequency decision maker, and a digital loop filter, connected downstream of the phase detector device, for actuating the digitally controlled oscillator.

10 Claims, 4 Drawing Sheets

U.S. PATENT DOCUMENTS

| | | | |
|---|---|---|---|
| 6,052,034 A * | 4/2000 | Wang et al. ............... | 331/2 |
| 6,147,567 A | 11/2000 | Welland et al. | |
| 6,150,891 A | 11/2000 | Welland et al. | |
| 6,167,245 A | 12/2000 | Welland et al. | |
| 6,392,493 B1 * | 5/2002 | Minnis .................. | 331/1 A |
| 6,429,693 B1 | 8/2002 | Staszewski et al. | |
| 6,456,164 B1 * | 9/2002 | Fan ..................... | 331/16 |
| 6,504,437 B1 * | 1/2003 | Nelson et al. ............ | 331/14 |
| 6,580,376 B2 | 6/2003 | Perrott | |
| 6,606,004 B2 * | 8/2003 | Staszewski et al. ........ | 331/17 |
| 6,844,836 B1 * | 1/2005 | Lee ..................... | 341/143 |
| 6,927,716 B2 * | 8/2005 | Keaveney et al. ......... | 341/143 |
| 7,061,276 B2 * | 6/2006 | Xu ...................... | 327/2 |
| 7,075,383 B2 | 7/2006 | Adachi et al. ............ | 332/127 |
| 7,276,978 B2 * | 10/2007 | Puma et al. .............. | 331/16 |
| 2001/0050579 A1 | 12/2001 | Han | |
| 2002/0167360 A1 | 11/2002 | Smith | |
| 2003/0020550 A1 | 1/2003 | Nelson et al. | |
| 2005/0077969 A1 * | 4/2005 | Lalt et al. ............... | 331/1 A |

FOREIGN PATENT DOCUMENTS

| | | |
|---|---|---|
| DE | 100 22 486 C1 | 1/2002 |
| DE | 103 03 405 | 8/2004 |

OTHER PUBLICATIONS

An Oversampling Delta-Sigma Frequency Discriminator, IEEE Transactions on Circuits and Systems II: Analog and Digital Signal Processing, IEEE Inc. New York, US, vol. 41, No. 1, Jan. 1994, pp. 26-32.

Delta-Sigma Modulation in Fractional-N Frequency Synthesis, T.A. D. Riley, IEEE Journal of Solid State Circuits, vol. 28, No. 5, 1993, pp. 553-559.

Explicit Formulas for Lattice Wave Digital Filters, L. Gazsi, IEEE Trans. On Circuits and Systems, vol. 32, No. 1, Jan. 1985, pp. 68-88.

A New PLL Frequency Synthesizer with High Switching Speed, A. Kajiwara et al., IEEE Trans. Veh. Technol., vol. 41, No. 4, Nov. 1992, pp. 407-413.

Fractional-N Frequency Synthesizer Design at the Transfer Function Level Using a Direct Closed Loop Realization Algorithm, C. Lau, et al., DAC 2003, Anaheim, California, Jun. 2-6, 2006, pp. 526-531.

A Modeling Approach for Σ-Δ Fractional-N Frequency Synthesizers Allowing Straightforward Noise Analysis, M. Perrott, et al., IEEE Journal of Solid State Circuits, vol. 37, No. 8, Aug. 2002, pp. 1028-1038.

Wave Digital Filters: Theory and Practice, A. Fettweis, Proc. IEEE, vol. 74, No. 2, Feb. 1986, pp. 270-327.

* cited by examiner

DIGITAL PHASE LOCKED LOOP FOR SUB-μ TECHNOLOGIES

CROSS-REFERENCE TO RELATED APPLICATIONS

This application is a continuation of international application PCT/DE2005/000030, filed Jan. 12, 2005, which claims priority to German Patent Application No. DE 102004006995.6 filed Feb. 12, 2004, both of which are incorporated herein in their entirety by this reference.

BACKGROUND

1. Field of the Invention

The invention relates to a digital phase locked loop for generating an output frequency using a digitally controlled oscillator.

2. Description of the Known Technology

Digital phase locked loops, known as PLLs, are used in a large number of integrated circuits. PLLs are used as clock and frequency synthesizers, clock generators and clock multipliers. PLLs are employed in time, data and clock recovery circuits and are also used in reception and transmission circuits in phase modulated or frequency modulated systems.

Current applications use analog PLLs, which comprise a phase/frequency detector (PFD) which compares the output frequency of a voltage controlled oscillator (VCO) to a reference frequency and, as output signal, generates a voltage which contains the information for the phase and frequency difference between the output frequency of the voltage controlled oscillator and the reference frequency. The voltage signal is supplied to a charge pump (CP) which converts the voltage signal into a corresponding current signal. This current signal is supplied to a loop filter (LF) whose output signal actuates the voltage controlled oscillator. The feedback path between the voltage controlled oscillator and the phase/frequency detector may contain a frequency divider with a division factor N. In the locked state of the PLL, the output frequency of the voltage controlled oscillator corresponds to N times the reference frequency.

Attempts have been made to design and implement fully integrated PLLs. In this context, the use of modern CMOS technologies is subject to conditions (for example reduced voltage and power supply, gate leakage currents, reduced gm*r product (gain)) which are less favorable for analog circuits than for digital circuits. Future CMOS technologies will provide faster nMOS and pMOS transistors, which are excellently suited to digital circuits. In addition, more than eight metal layers will be implementable, which allow spiral shaped inductor structures, and there is the option of implementing MOS varactor fields. This favors the implementation of digitally controlled VCOs, known as DCOs (Digital Controlled Oscillator), in comparison with analog oscillators.

Patent specification DE 100 22 486 C1 discloses a digital phase locked loop which can be implemented in integrated form. The phase detector device in this circuit comprises an essentially analog phase/frequency detector.

U.S. Pat. No. 6,429,693 discloses a further digital PLL which is compatible with modern sub μ CMOS technologies. The digital phase/frequency detector comprises a time to digital converter whose resolution is given by the switching delay of an inverter implemented in the CMOS process.

In such digital phase/frequency detectors, a digital word representing the reference frequency is subtracted from a digital word which relates to the (possibly divided) output frequency of the digitally controlled oscillator in order to generate the phase/frequency error value which corresponds to the output signal from an analog phase/frequency detector. The primary drawback of this practice is the occurrence of uncontrollable spurious frequencies which arise on account of the finite word length of the digital words which are to be subtracted from one another.

The publication "Delta Sigma Modulation in Fractional N Frequency Synthesis", T. A. Riley, M. A. Copeland and T. A. Kwasniewski, Journal of Solid State Circuits (JSSC), volume 28, No. 5, pages 553 to 559, May 1993, describes the use of a delta sigma modulator for the signal actuating a frequency divider. The frequency divider is in the form of a dual modulus divider. The delta sigma modulation reduces the influence of spurious frequencies in comparison with known fractional N dividers in phase locked loops.

The publication "An Oversampling Delta Sigma Frequency Discriminator", R. D. Beards, M. A. Copeland, IEEE Transactions on Circuits and Systems II.: Analog and Digital Signal Processing, volume 41, No. 1, pages 26 to 32, January 1994, specifies a frequency divider circuit which comprises a dual modulus frequency divider and a phase comparator which is connected downstream of the frequency divider. The implementation advantage of this circuit is that dual modulus frequency dividers are relatively simple digital circuits which can be operated at high frequency (several gigahertz) with low power consumption. The frequency decision maker is used in the front end of an intermediate frequency heterodyne receiver.

SUMMARY

Disclosed is a digital PLL which has a high level of digitization, allowing excellent PLL properties under various conditions (manufacturing and/or operational conditions). In particular, as few spurious frequencies as possible should occur and PLL properties, such as jitter (phase noise), jitter tolerance, bandwidth in the steady state, frequency resolution, phase/frequency modulation etc. should be able to be controlled or set easily and according to the respective field of use using suitable design parameters.

The PLL has a digitally controlled oscillator for generating an output frequency. In addition, the digital control loop comprises a phase detector device for detecting the phase difference between a reference frequency and a frequency which is dependent on the output frequency of the oscillator, and for converting the phase difference into a digital control signal. A digital loop filter is used to supply the digital control signal or a digital signal derived from the digital control signal to the digitally controlled oscillator in order to set the output frequency. The digital phase locked loop is characterized in that the phase detector device comprises a delta sigma frequency decision maker.

The use of a delta sigma frequency decision maker in the phase detector device means that the latter is of simple design which is suitable for integration into sub μ CMOS processes. A further fundamental advantage is that the noise generated by the frequency quantization is shifted into a higher frequency range above the transmission bandwidth limit for the steady state PLL. This significantly improves the rejection of spurious frequencies. A further advantage of the PLL is that the delta sigma frequency decision maker means that it is possible to dispense with a charge pump circuit in the signal path downstream of the frequency decision maker. This means that it is possible for the entire digital phase locked loop to comprise no kind of integrated or discrete capacitors.

Furthermore, the inventive digital phase locked loop can have distinguished properties in relation to jitter and transient response.

In another embodiment, the delta sigma frequency decision maker has a downstream digital frequency control device for generating a digital signal, which contains frequency values, for actuating the loop filter. This frequency control device can be implemented by means of a simple dual path multiplexer.

In another embodiment, the digital loop filter is of the third or a higher order. A third order loop filter achieves attenuation of 60 dB/decade, which filters out the frequency quantization noise to a sufficient extent. The digital loop filter is preferably of the Butterworth, Bessel, Chebishev or Cauer type, the last two filter types mentioned being particularly preferred on account of their steep cutout characteristic.

In yet another embodiment, a wave digital filter is chosen as the digital loop filter. Wave digital filters require only a short word length of the filter coefficients and for the internal state variables. In addition, wave digital filters require a lower power consumption than ordinary digital filters. A further advantage in the use of wave digital filters is that they have an excellent recovery response after overflow, as may be caused by a noise pulse, for example. The inherent passivity of a wave digital filter means that the filter response to an input noise pulse should completely disappear. Wave digital filters can be found in the publication "Explicit Formulas for Lattice Wave Digital Filters", L. Gazsi, IEEE Transactions on Circuits and Systems, volume 32, No. 1, pages 68 to 88, January 1985.

In another embodiment, the digital frequency control device and the loop filter have an integrator arranged between them. The digital integrator has the task of converting frequency information into phase information. Although the digital integrator may also be provided at a different position in the signal path, e.g. downstream of the loop filter or between a sampling rate conversion circuit (described in more detail below) and a noise shaper (noise shaping stage), its optimum position is between the digital frequency control device and the loop filter, since in this position there are an optimum dynamic control range and a low power consumption.

In still yet another embodiment, the signal path downstream of the loop filter contains a quantizer which requantizes input values onto output values with a reduced word length. The quantizer can firstly match the normally longer word length in the digital loop filter to the shorter word length of the input of the digitally controlled oscillator. Secondly, the phase noise (jitter) caused by the quantization error can in line with one particular preferred refinement of the quantizer be shifted toward higher frequencies by increasing the sampling rate in the quantizer. This is advantageous particularly if the quantizer additionally comprises a noise shaper, since although this noise shaper reduces the phase noise at low frequencies it amplifies it at high frequencies.

Further objects, features and advantages of this invention will become readily apparent to persons skilled in the art after a review of the following description, with reference to the drawings and claims that are appended to and form a part of this specification.

DETAILED DESCRIPTION

Figure 1:
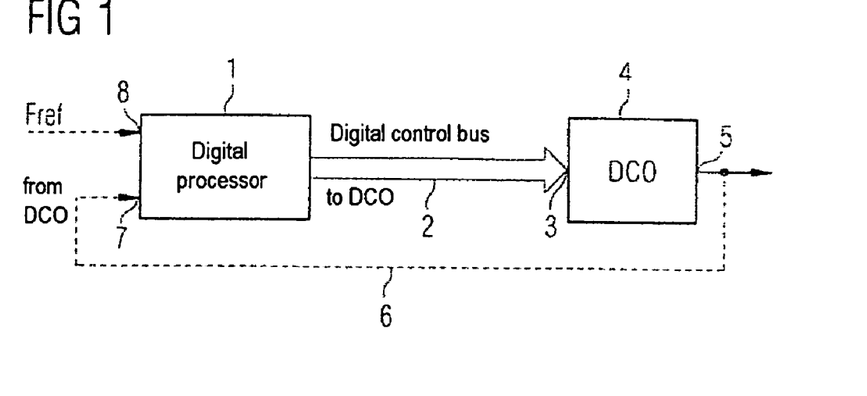
FIG. 1 shows the architecture of an inventive digital PLL using a digitally controlled oscillator.

FIG. 1 shows the general design of a digital PLL. The digital PLL includes a digital processor 1 which is connected to the input 3 of a digitally controlled oscillator (DCO) 4 via a digital control bus 2. The output 5 of the digitally controlled oscillator outputs an analog frequency signal. This signal is supplied to a first input 7 of the digital processor 1 via an electrical connection 6. A second input 8 of the digital processor 1 has a reference frequency or a reference clock Fref applied to it. The circuit shown in FIG. 1 can be produced in a single integrated circuit in fully integrated form.

Figure 2:
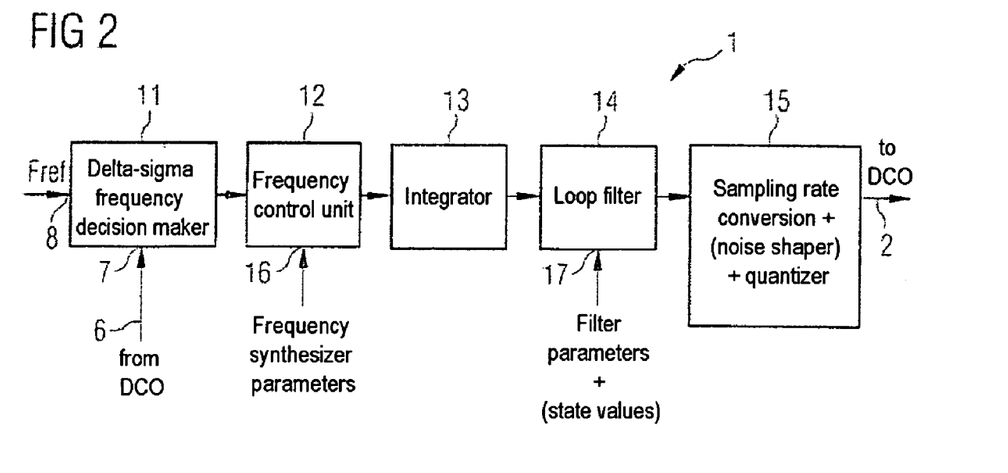
FIG. 2 shows the design of the digital processor shown in FIG. 1.

FIG. 2 shows a block diagram of the digital processor 1. The digital signal processor 1 includes a delta sigma frequency decision maker 11, a digital frequency control unit 12, a digital integrator 13, a digital loop filter 14 and a digital quantization and rate conversion unit 15. The reference frequency Fref and the output signal from the digitally controlled oscillator 4 are supplied to the delta sigma frequency decision maker 11. The digital frequency control unit 12 receives frequency synthesis parameters via an input 16. Filter parameters and possibly also state values can be supplied to the digital loop filter 14 via an input 17. The design of the individual blocks and also the way in which the circuit shown in FIG. 2 works are explained in more detail below with reference to FIGS. 3 to 7.

Figure 3:
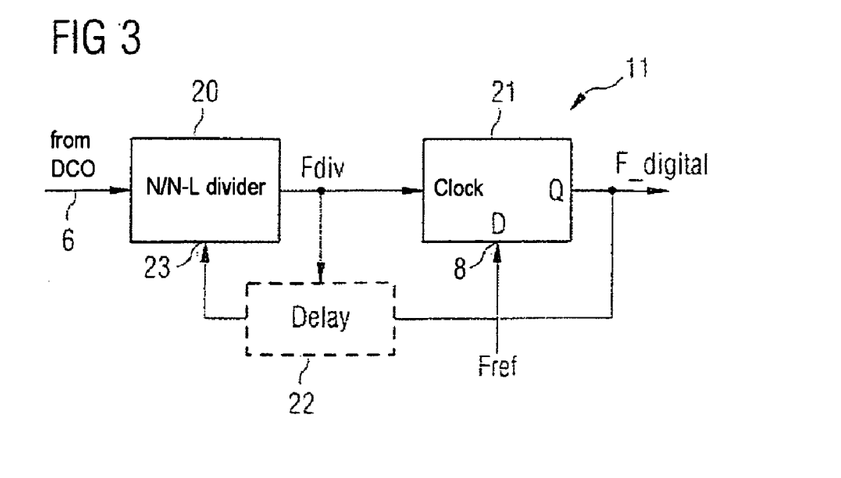
FIG. 3 shows a circuit diagram of the oversampling delta sigma frequency decision maker shown in FIG. 2.

FIG. 3 shows the circuit design of the delta sigma frequency decision maker 11. The analog output signal from the digitally controlled oscillator 4 is supplied to the input of a dual modulus divider circuit 20 with suitably chosen division factors N and N–L. The frequency divided output signal Fdif from the dual modulus frequency divider circuit 20 is firstly connected to the clock input of a phase comparator 21 and secondly prescribes the clock for a delay element 22 via which an output signal F_digital from the phase comparator 21 is applied to the input 23 of the dual modulus divider circuit 20 in order to select the division factor. By way of example, the frequency comparator 21 is in the form of a simple D-type flip-flop, with the reference frequency Fref being supplied to the D-input 8 of the flip-flop 21.

The (first order) delta sigma frequency decision maker 11 is used to convert the frequency/phase information from the digitally controlled oscillator 4 into the digital domain. The delta sigma frequency decision maker 11 implements coarse quantization of the frequency error between the reference frequency Fref and the output frequency of the digitally controlled oscillator 4 with an accuracy of 1 bit. In addition, the (binary) output bit stream F_digital is subjected to noise shaping, i.e. the noise caused by the frequency quantization is shifted to a higher frequency range.

The way in which the delta sigma frequency decision maker 11 shown in FIG. 3 works is known in the prior art and is described in detail in the article "An Oversampling Delta Sigma Frequency Discriminator" by R. D. Beards and A. Copeland, mentioned at the output, for example. This article shows that the circuit shown in FIG. 3 has the same properties as a conventional first-order delta sigma modulator, i.e. the quantization noise at the output is rejected by means of high pass filtering. The output signal (bit stream) F_digital from the flip-flop 21 may in this case be regarded as an arithmetic sign for the phase difference between the reference frequency Fref and the output frequency signal from the digitally controlled oscillator 4, i.e. the flip-flop 21 acts as a phase quantizer (phase decision maker) producing a 1 bit approximation of this phase difference. It is also pointed out that the clock frequency Fdiv at which the flip-flop 21 and also the delay element 22 are clocked, and which represents the sampling rate of the digital (binary) output bitstream F_digital from the flip-flop 21, corresponds approximately to the reference frequency Fref in the steady state of the PLL. It is also pointed out that the phase comparator 21 may be of more complex design in reality and, in addition to the D-type flip-flop, has a phase/frequency detector in order to change the control loop to the steady state in the transient process.

The bit stream F_digital is supplied to the frequency control unit 12. This unit is shown in more detail in FIG. 4. Its task is to stipulate the output frequency of the digitally controlled oscillator 4. The frequency control unit 12 essentially comprises a dual path multiplexer MUX 30, to which two different frequency control parameters vx and vy are supplied at its multiplexer inputs. The multiplexer input 0 (i.e. the frequency control parameter vy) is chosen when the control signal F_digital has the logic state 0. Otherwise, i.e. when the logic state of the control signal F_digital is 1, the multiplexer input 1 (i.e. the frequency control parameter vx) is chosen. The respectively chosen frequency control parameter vx or vy is represented as a digital word (with a word length of 20, for example) and forms the output signal F_synt from the frequency control unit 12.

Figure 4:
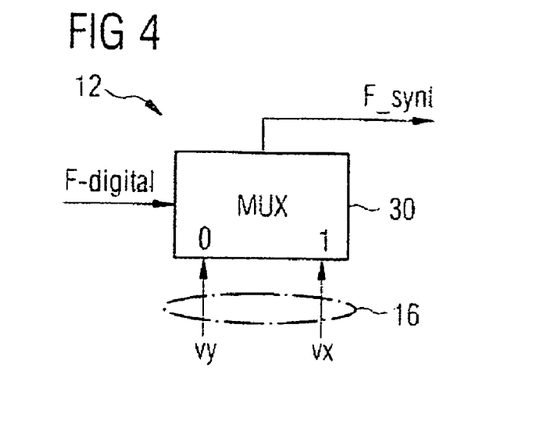
FIG. 4 shows a circuit diagram of the frequency control unit shown in FIG. 2.

Referring to FIGS. 3 and 4, the output bit stream F_digital from the delta-sigma frequency decision maker 11 controls both the dual-modulus frequency divider circuit 20 and the multiplexer 30: if F_digital is equal to 0 then the division factor of the dual modulus divider circuit 20 at the next sampling time is the value N and the output value from the multiplexer 30 is the constant value vy. If F_digital has the value 1, the dual modulus divider circuit 20 will use the division value N−L at the subsequent sampling time, and the value of F_synt is vx. The values of vy and vx are constant. They can be calculated in advance and stored in a ROM, RAM or a flash memory chip.

The useful frequency range of the digitally controllable oscillator 4 is dependent on the admissible maximum and minimum values which can be transmitted from the processor 1 to the oscillator 4 via the digital control bus 2. It is widely known that averaging in the time domain allows the frequency resolution of the output signal from the digitally controllable oscillator 4 to be very finely adjusted and means that it is almost solely dependent on the bit accuracy of the digital processor 1. If the PLL is operated as a frequency synthesizer, the synthesized output frequency of the oscillator 4 is obtained as $$F\text{goal}=n*F\text{ref},\quad(1)$$

where n is any real number and Fgoal is the desired output frequency of the oscillator 4.

This allows continuous frequency tuning. This requires values of n to be chosen such that Fgoal covers the admissible tuning range of the frequency synthesizer.

For known values of Fgoal and Fref, the frequency control parameters vx and vy of the frequency control circuit 12 can be calculated as follows:

The integer division factor N is obtained from the equation $$N=[F\text{goal}/F\text{ref}],\quad(2)$$

where [•] denotes the integer part of the bracketed expression+1. L denotes an integer design parameter which is chosen in order to select a suitable value for a division factor Nfrac. Nfrac is obtained in line with $$N\text{frac}=(N-F\text{goal}/F\text{ref})/L.\quad(3)$$

On the basis of the relationship which follows from equations (1) to (3)

$$n=N-N\text{frac}*L\quad(4)$$

Nfrac is the L scaled fractional division factor.

The frequency control parameters vy and vx are now defined in line with the following equations $$vy=N\text{frac}$$

and $$vx=N\text{frac}-1.\quad(5)$$

The result of equations (1) to (5) is that for a given ratio of Fgoal/Fref (i.e. for a given division factor n), when different values of L are used, different scaled fractional division factors Nfrac and hence also different frequency control parameters vx and vy are obtained.

The frequency control unit 12 may also be used to impress frequency modulation onto the output signal from the digitally controlled oscillator 4. To explain this option, the scaled fractional division factor Nfrac is written in the following form:

$$N\text{frac}=N\text{frac}0+\text{mod\_}N\text{frac},\quad(6)$$

where Nfrac0 is the (scaled) fractional division value without modulation and mod_Nfrac is the (scaled) digital input value for the frequency modulation. Assuming that the modulated output frequency from the digitally controlled oscillator 4 is given by the expression $$F\text{goal}=F\text{goal}0+\text{mod\_}_{freq}\quad(7)$$

where Fgoal0 is the output frequency of the oscillator 4 without modulation and mod_freq is the modulation component of the output frequency of the oscillator 4, equation (4) results in the following relationship:

$$\text{mod\_}_{freq}=\text{mod}\,N\text{frac}*L*F\text{ref}.\quad(8)$$

Since L and Fref are constant during modulation, suitable digital signal processing for the now variable frequency control parameters vx and vy allows digital modulation of the output frequency of the digitally controlled oscillator 4 to be obtained.

In line with FIG. 2, the digital output signal F_synt from the frequency control unit 12 is supplied to the digital integrator 13. The digital integrator converts the digital frequency information into phase information by means of integration. The phase information available at the output of the integrator 13 is a phase error signal with a linear response for the tracking characteristic of the PLL. The digital integrator 13 may also be arranged at a different point in the signal path, e.g. downstream of the loop filter 14 or between the rate conversion unit (explained later) and the noise shaper (noise shaping stage).

The linearity of the phase error signal at the output of the integrator 13 allows the digital loop filter 14 to be implemented in a manner which is known per se. The use of a digital loop filter 14 allows entirely new options in comparison with analog filter arrangements: first, the digital PLL requires no charge pump and hence also no kind of (integrated or discrete) capacitors. Secondly, a transfer function for the closed loop can be implemented with a higher (third or fourth) order without using inductors or active loop filter topologies. Thirdly, the shape of the transfer function of the closed loop can be stipulated in line with the Butterworth, Bessel, Chebishev and Cauer filter specifications. Consequently, digital filters can be used to attain highly selective cutoff characteristics for the transfer function which cannot be achieved with an analog PLL using a charge pump. The reason for this is the presence of parasitic poles and null points in an analog PLL, which exert second-order effects on the transfer function of the closed PLL and thereby impair the stability of an analog PLL unacceptably.

For the present invention, the use of a higher (3rd or 4th) order transfer function with a sharp cutoff frequency for (digital) PLL for the closed loop is very advantageous because, as already mentioned, the primary drawback of digital processors is the presence of spurious frequencies caused by the finite word length. It is important to be able to control or master these spurious frequencies or noise for all process and temperature variations which occur during manufacture or operation of the PLL. This is because noise destroys the spectrum of the PLL's output frequency and raises the noise level (noise floor) of the PLL. In other words, noise reduces the phase noise quality (jitter quality of the PLL).

As already explained, a fundamental advantage of the delta sigma frequency decision maker 11 is that of shifting noise to the stopband of the digital PLL's transfer function and thereby creating the possibility of effectively damping the PLL using the loop filter. However, the noise shaping function of the delta-sigma frequency decision maker 11 has a noise gain of +20 dB/decade, so that an ordinary second-order loop filter attenuates the noise caused by the frequency quantization only by −20 dB/decade instead of its actual attenuation by −40 dB/decade in the stopband. To achieve an attenuation of −40 dB/decade in the stopband, it is therefore necessary to have at least one loop filter with an attenuation of −60 dB/decade (i.e. at least one 3rd-order filter), a particularly sharp-edged cutoff response being achieved by Chebishev and Cauer filters of said filter order.

It is known that noise analysis is of central importance to analog PLLs. Nothing else holds true for a PLL which involves digital signal processing. However, differences exist between the digital and analog approaches: when a digital loop filter is being used, it is necessary to perform "bit true" analysis for two aspects, namely truncation (cutoff) of bits at the least significant bit (LSB) and correction of an overflow at the position of the most significant bit (MSB). In addition, by scaling the internal digital signals within the loop, the dynamic range of the individual digital circuit elements needs to be used in optimum fashion and coordinated among one another. These mechanisms require a relatively high level of knowhow in the field of digital technology. To reduce the word length requirements of the filter coefficients and the internal state variables, it is therefore advantageous for the loop filter 14 used to be a wave digital filter. This provides beneficial influence for the power consumption of the filter and its recovery properties in the event of a sudden overflow in the input signal.

Figure 5:
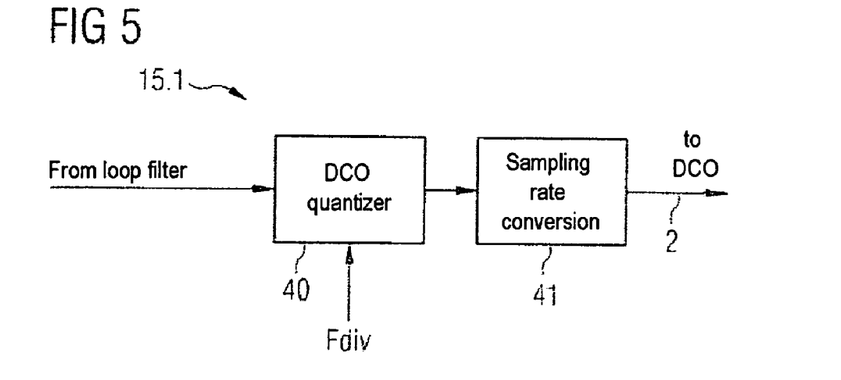
FIG. 5 shows a circuit diagram of the quantization and rate conversion unit shown in FIG. 2.

FIG. 5 shows a first variant 15.1 of the quantization and rate conversion unit 15 shown in FIG. 2. The quantization and rate conversion unit 15.1 comprises a quantizer 40 which feeds a rate conversion stage 41. The output of the rate conversion stage 41 is connected to the digital control bus 2.

The digital filter is clocked at the frequency Fdiv, which is generally different than the frequency Fgoal of the output signal from the digitally controlled oscillator 4. Consequently, sampling rate conversion is required between the output of the digital loop filter 14 and the input 3 of the digitally controlled oscillator 4. In addition, the word length of the digital signal processed in the digital loop filter 14 is normally longer (20 bits or more) than the admissible input word length for the digitally controlled oscillator 4, which is usually shorter than 14 bits. Consequently, the frequency/phase information must (depending on whether the integrator 13 is provided at the position shown in FIG. 2 or not until within the quantization and phase conversion unit 15) be quantized again (the first quantization onto individual bits was performed in the delta sigma frequency decision maker 11 itself). The quantizer 40 is subsequently called a DCO quantizer.

If the quantization error caused by the DCO quantizer 40 is negligible (this applies for n≈1, for example) then the output frequency signal from the digital loop filter 14 can be quantized directly (the sampling rate is the frequency Fdiv and, in the steady state, corresponds approximately to the reference frequency Fref). The rate conversion can be performed by a simple repeater 41.

Figure 6:
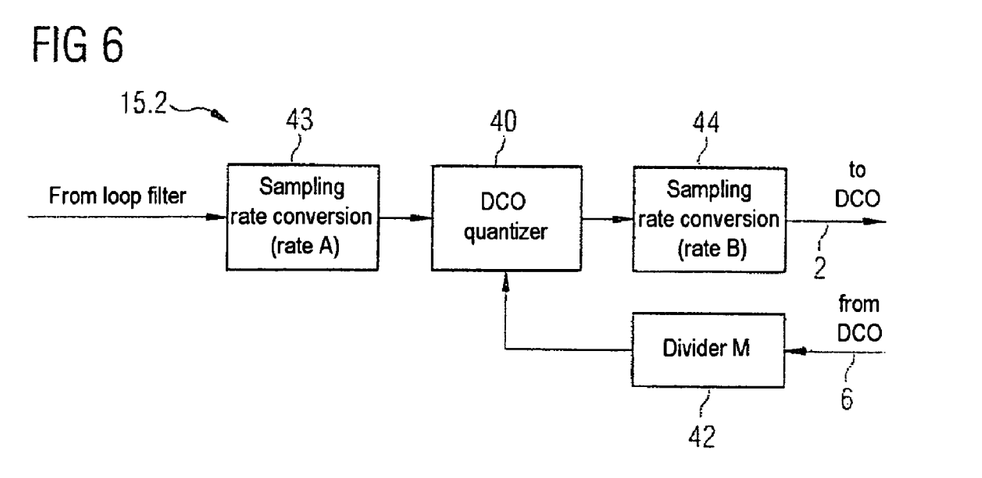
FIG. 6 shows a first variant of the quantization and rate conversion unit shown in FIG. 2.

FIG. 6 shows a variant 15.2 of the quantization and rate conversion unit 15 when n>>1. In this case, Fgoal is significantly greater than Fref, which is the normal case in transmission/receiver circuits in phase-modulated or frequency-modulated systems. If the influence of the DCO quantizer 40 is not negligible, it can be significantly reduced or avoided by the arrangement shown in FIG. 6. Since the quantization error and its spectral power density are inversely proportional to the clock frequency of the DCO quantizer 40, the quantization error of the DCO quantizer 40 can be reduced by shifting the clock frequency of the DCO quantizer 40 toward higher frequencies. For this purpose, the quantization and rate conversion unit 15.2 shown in FIG. 6 comprises a divider circuit 42 which is used to generate a suitable clock for the DCO quantizer 40. The divider circuit 42 divides the output signal received at the input from the digitally controlled oscillator 4 by the integer division factor M, and supplies the frequency-divided signal to the clock input of the DCO quantizer 40. The value M needs to be chosen such that a sufficient reduction in the quantization error is obtained. In this case, two sampling rate conversion stages 43, 44 with different conversion factors A and B are required. The sampling rate conversion stage 43 with the conversion factor A is arranged upstream of the DCO quantizer 40, while the sampling rate conversion stage 44 with the conversion factor B is connected downstream of the DCO quantizer 40. The sampling rate conversion stage 43 interpolates the sampling rate at the output of the loop filter Fdiv into a sampling rate which corresponds to the output frequency of the digitally controlled oscillator 4 divided by M. The second sampling rate conversion stage 44 interpolates the sampling rate by the factor M. Both sampling rate conversions can be implemented using a simple repeater.

By choosing a suitable division factor M, a compromise can be made between power consumption and elimination of the quantization error in the DCO quantizer 40. The higher the clock frequency of the DCO quantizer, the higher the power consumption and the smaller the quantization error in the circuit shown in FIG. 6.

Figure 7:
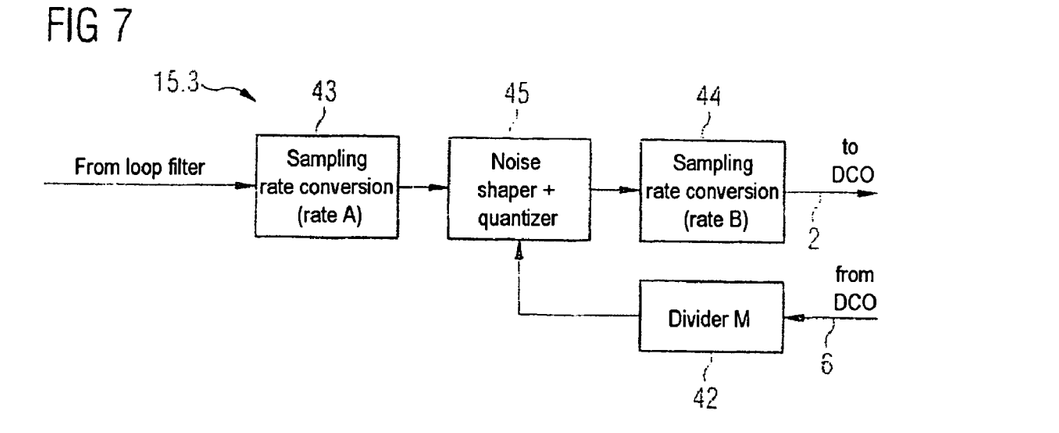
FIG. 7 shows a second variant of the quantization and rate conversion unit shown in FIG. 2.

FIG. 7 shows a third variant 15.3 of the quantization and rate conversion unit 15 which differs from the second variant 15.2 merely in that the DCO quantizer 45 additionally contains a noise shaper. This solution is advantageous when, despite the increased (in comparison with Fdiv) clock rate of the DCO quantizer 40 an excessive quantization error still remains (i.e. a small value is chosen for M) or when the small value M causes implementation problems. The DCO quantizer with the noise shaper 45 has two functions. First, it performs the requisite quantization. Secondly, it reduces the influence of the quantization error by shifting the phase noise (jitter) toward higher frequencies. The noise shaper therefore reduces the influence of the quantization error (phase noise) at low frequencies, but at the same time amplifies the phase noise at higher frequencies. In the case of a first order noise shaper, the gain is +20 dB/decade at higher frequencies. It is therefore possible to select and coordinate the division factor M and the order of the noise shaper such that the quantization error (taking into account the amplification by the respective noise shaper) is shifted to an optimum frequency range.

The statements above show that a large number of design parameters (L, type and order of the digital loop filter 14, position of the integrator 13, M, order of the noise shaper in the DCO quantizer 45, stipulation of the word length of the individual digital circuit elements etc.) are available for designing, for the respective instance of application, that PLL which exhibits an optimum response in respect of process or temperature variations which occur during manufacture or during operation, with the requirements of future CMOS technologies far below μ feature sizes being able to be observed and utilized.

The text below presents a specific example of the present invention which does not restrict the general nature: by way of example, the fundamental parameters of the digital processor are:

$Fref=300$ MHz; $Fgoal=4.8648$ GHz;

for a selection of L=2, the following is obtained:

$n=4864.8/300=16.216$, hence, $N=17$, $N-L=15$.

It follows from this that $Nfrac=(N-n)/L=(17-16.216)/2=0.392$.

These values produce the following values for the frequency control parameters vy and vx:

$vy=Nfrac=0.392$ $vx=Nfrac-1=-0.608$.

When using an internal word length of 20 bits for the frequency control unit 12, the frequency control parameters vx, vy are represented by the following values:

$vy\_int=round(vy*524288)=205521$ $vx\_int=round(vx*524288)=-318767$ where vy_int and vx_int are the frequency control parameters vy and vx expressed in the least significant bits using the rounding operation $524288=2^{19}$ (which corresponds to the 20-bit representation).

$KT=1/400$ MHz and $F0=4.913448$ GHz denote the parameters of the digitally controlled oscillator 4. KT denotes the gain factor and F0 denotes the freewheel frequency of the oscillator.

To complete the PLL, the design parameters for the digital filter 14 and for the DCO quantizer 40 (see FIG. 5) are also required. The quantizer 40 is meant to have a word length of 14 bits. It is assumed that the transfer function of the closed PLL exhibits a third-order Butterworth shape (−60 dB/decade attenuation) with a cutoff frequency of fco=800 KHz.

Figure 8:
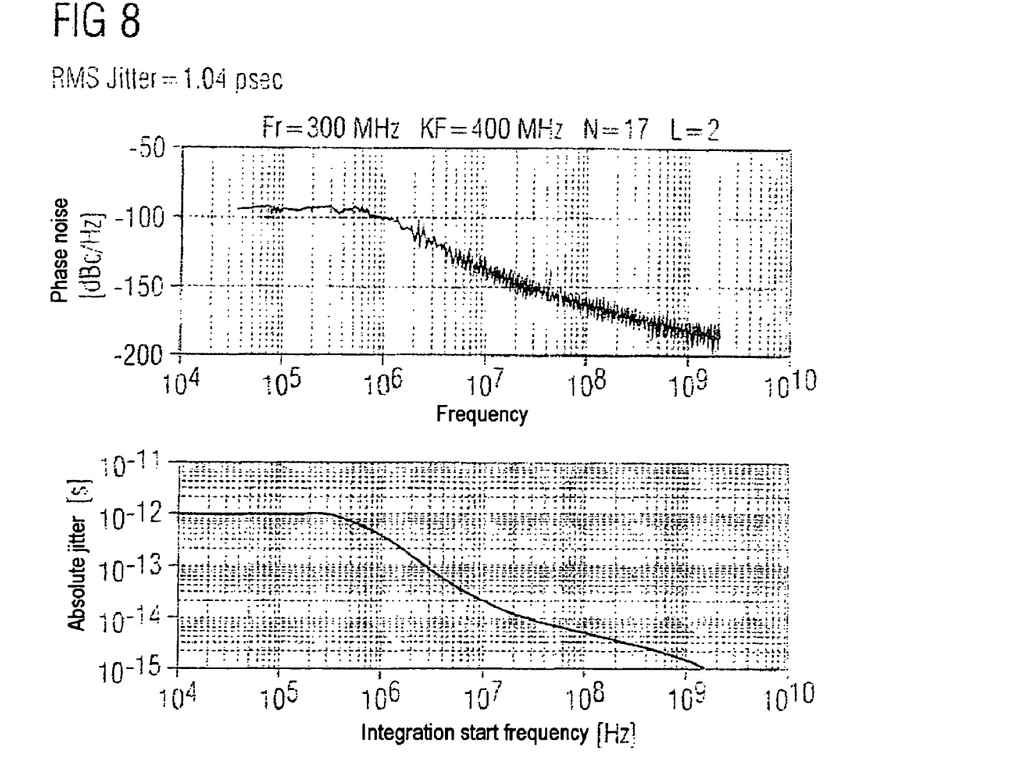
FIG. 8 shows two graphs showing the phase noise or the accumulated phase noise (absolute jitter) over frequency.
Figure 9:
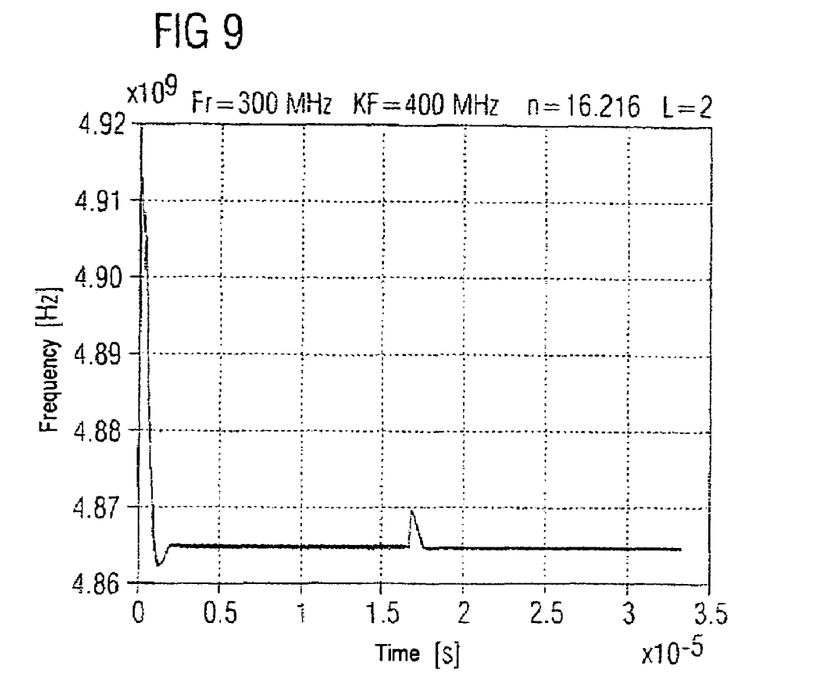
FIG. 9 shows a graph showing a simulated output signal from the digitally controlled oscillator over time.
Figure 10:
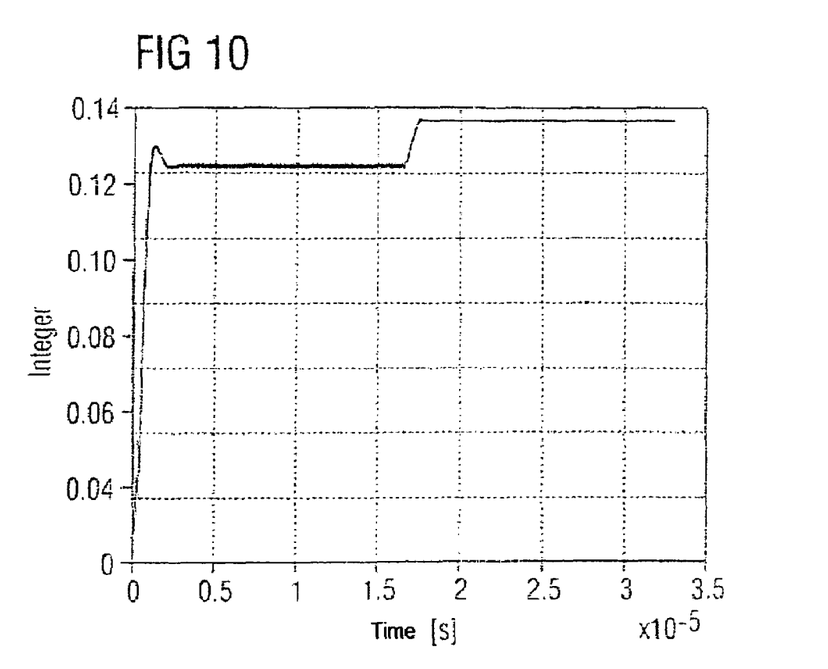
FIG. 10 shows a graph showing the digitally controlled oscillator's digital input signal corresponding to that in FIG. 9 over time.

FIGS. 8 to 10 show simulation results for a PLL of this kind. In this case, a hysteresis of 2 ps in the delta-sigma frequency decision maker 11 has been assumed.

The top part of FIG. 8 shows the total phase noise in the PLL in the steady state by the frequency output of the digitally controlled oscillator 4 over the frequency in Hz. The bottom part of FIG. 8 shows the integrated average (RMS) jitter over the frequency in Hz. In both illustrations, the x axis represents the frequency offset from the carrier frequency Fgoal. The illustrations make clear the excellent jitter response without spurious frequency tones.

FIG. 9 shows an illustration showing the output frequency of the PLL over time (in seconds). The curve has been ascertained by means of a simulation calculation using the parameters indicated above. It shows the transient response of the PLL and also the reaction of the PLL to a sudden parameter change in the digitally controlled oscillator 4.

The digitally controlled oscillator 4 starts at a freewheel frequency of 4.913448 GHz at t=0. FIG. 9 shows that after 2 μs the target frequency Fgoal of 4.8648 GHz has been reached. The frequency change during the transient process is 48.648 MHz.

Parameter changes in the digital PLL can occur either during the manufacturing process or during operation (e.g. as a temperature drift). Essentially, significant changes can occur only in two parameters: the KT value and the freewheel frequency. Both parameters relate to the digitally controlled oscillator 4. The digital processor 1 is insensitive to temperature drifts and other changes.

At time t=1.68 μs, a sudden, stepped change in the KT gain factor in the digitally controlled oscillator 4 by 10% is simulatively prescribed. FIG. 9 shows that the digitally controlled oscillator 4 has returned to the target frequency Fgoal after a short transition time.

FIG. 10 shows the relevant change at the input of the digitally controlled oscillator 4 (i.e. at the output of the quantization and rate conversion unit 15). It becomes clear that the change occurring at 1.68 μs is maintained. The reason for this is that it is necessary to compensate for the simulated change in the KT gain factor in the closed loop. A similar result is obtained for a change in the freewheel frequency of the digitally controlled oscillator 4.

In summary, it can be stated that the present invention allows a central circuit part of transmitters and receivers to be designed using a technology which is also suitable for future CMOS technologies with feature sizes significantly below the μ range, with particularly the use of integrated or discrete capacitances being able to be avoided.

I claim:

1. A digital phase locked loop system, comprising:
   a digitally controlled oscillator for generating an output frequency;
   a phase detector device for detecting the phase difference between a reference frequency and a frequency which is dependent on the output frequency of the oscillator and for converting the phase difference into a digital control signal, where the phase detector device includes a delta-sigma frequency decision maker;
   a digital loop filter via which the digital control signal or a digital signal which is derived from the digital control signal is supplied to the digitally controlled oscillator in order to set the output frequency, wherein a stage for increasing the sampling rate is arranged between the digital loop filter and the digitally controlled oscillator; and wherein the delta-sigma frequency decision maker comprises a multimodulus frequency divider and a phase comparator connected downstream of the multimodulus frequency divider, where the output signal from the phase comparator is fed back to a control input of the multimodulus frequency divider in order to select the division factor for the multimodulus frequency divider.

2. The system of claim 1, further comprising a quantizer which is connected downstream of the digital loop filter and which requantizes input values onto output values with a reduced word length.

3. The system of claim 2, wherein the clock for the quantizer is derived from the output frequency of the digitally controlled oscillator using a frequency divider.

4. The system of claim 2, wherein the quantizer comprises a noise shaper for shifting the phase noise toward higher frequencies.

5. The system of claim 1, further comprising a digital frequency control device connected downstream of the delta-sigma frequency decision maker, for generating a digital signal, containing frequency values, for actuating the loop filter.

6. The system of claim 5, further comprising a digital integrator arranged between the digital frequency control device and the digital loop filter.

7. The system of claim 1 wherein the digital loop filter is of the third or a higher order.

8. The system of claim 1 wherein the digital loop filter is of the Butterworth, Bessel, Chebishev or Cauer type.

9. The system of claim 1, wherein the digital loop filter is a wave digital filter.

10. A digital phase locked loop system comprising:
a digitally controlled oscillator for generating an output frequency;
a phase detector device for detecting the phase difference between a reference frequency and a frequency which is dependent on the output frequency of the oscillator and for converting the phase difference into a digital control signal, the phase detector device having a delta sigma frequency decision maker;
a digital loop filter via which the digital control signal or a digital signal derived from the digital control signal is supplied to the digitally controlled oscillator in order to set the output frequency, wherein a quantizer being connected downstream of the digital loop filter for requantizing input values onto output values with a reduced word length; and
wherein the delta-sigma frequency decision maker comprises a multimodulus frequency divider and a phase comparator connected downstream of the multimodulus frequency divider, where the output signal from the phase comparator is fed back to a control input of the multimodulus frequency divider in order to select the division factor for the multimodulus frequency divider.

* * * * *